United States Patent
Chang et al.

(10) Patent No.: US 9,268,448 B2
(45) Date of Patent: *Feb. 23, 2016

(54) DEVICE AND METHOD FOR PARALLEL-SCANNING DIFFERENTIAL TOUCH DETECTION

(71) Applicant: EGALAX_EMPIA TECHNOLOGY INC., Taipei (TW)

(72) Inventors: Chin-Fu Chang, Taipei (TW); Cheng-Han Lee, Taipei (TW); Chi-Hao Tang, Taipei (TW); Shun-Lung Ho, Taipei (TW)

(73) Assignee: EGALAX_EMPIA TECHNOLOGY INC., Taipei (TW)

( * ) Notice: Subject to any disclaimer, the term of this patent is extended or adjusted under 35 U.S.C. 154(b) by 101 days.

This patent is subject to a terminal disclaimer.

(21) Appl. No.: 14/029,917

(22) Filed: Sep. 18, 2013

(65) Prior Publication Data

US 2014/0015788 A1 Jan. 16, 2014

Related U.S. Application Data

(63) Continuation of application No. 12/901,896, filed on Oct. 11, 2010, now Pat. No. 8,564,557.

(60) Provisional application No. 61/250,051, filed on Oct. 9, 2009, provisional application No. 61/298,243, filed on Jan. 26, 2010, provisional application No. 61/298,252, filed on Jan. 26, 2010.

(51) Int. Cl.
| | | |
|---|---|---|
| *G06F 3/044* | (2006.01) | |
| *G06F 3/041* | (2006.01) | |
| *G01R 27/26* | (2006.01) | |
| *G06F 3/047* | (2006.01) | |

(52) U.S. Cl.
CPC ............ *G06F 3/044* (2013.01); *G01R 27/2605* (2013.01); *G06F 3/0412* (2013.01); *G06F 3/0416* (2013.01); *G06F 3/0418* (2013.01); *G06F 3/047* (2013.01); *G06F 2203/04103* (2013.01); *G06F 2203/04104* (2013.01); *G06F 2203/04111* (2013.01)

(58) Field of Classification Search
CPC ............................. G09G 3/2096; G09G 3/003
USPC ............ 345/173, 156, 204; 178/18.01–18.09; 341/33, 34

See application file for complete search history.

(56) References Cited

U.S. PATENT DOCUMENTS

| | | | |
|---|---|---|---|
| 5,357,266 A | | 10/1994 | Tagawa |
| 5,422,996 A | | 6/1995 | Patil et al. |
| 5,495,077 A | * | 2/1996 | Miller et al. ............... 178/18.06 |
| 5,708,368 A | | 1/1998 | Mallory |
| 5,729,251 A | * | 3/1998 | Nakashima ................... 709/250 |
| 5,861,583 A | * | 1/1999 | Schediwy et al. ......... 178/18.06 |
| 6,266,001 B1 | | 7/2001 | Fang et al. |
| 7,728,816 B2 | * | 6/2010 | Xu et al. ....................... 345/163 |
| 8,321,174 B1 | * | 11/2012 | Moyal et al. .................. 702/150 |

* cited by examiner

*Primary Examiner* — Shaheda Abdin
(74) *Attorney, Agent, or Firm* — WPAT, PC; Justin King

(57) ABSTRACT

A method for parallel-scanning differential touch detection is disclosed herein. The method includes generating a plurality of first outputs by a differential unit according to a plurality of first inputs provided by a plurality of sensors of a touch panel in each scan of total i scans, herein, the kth first output in the jth scan of the total i scans is the $(i*(k-1)+j)$th output in the continuous first outputs, $i \geq 2$, $j \geq 1$, $k \geq 1$, and $i$, $j$, $k$ are natural numbers. Wherein, the differential unit has a plurality of subtractors and the inputs of the subtractors are connected in series. By doing so, the noises between a touch panel and a display can be eliminated.

38 Claims, 23 Drawing Sheets

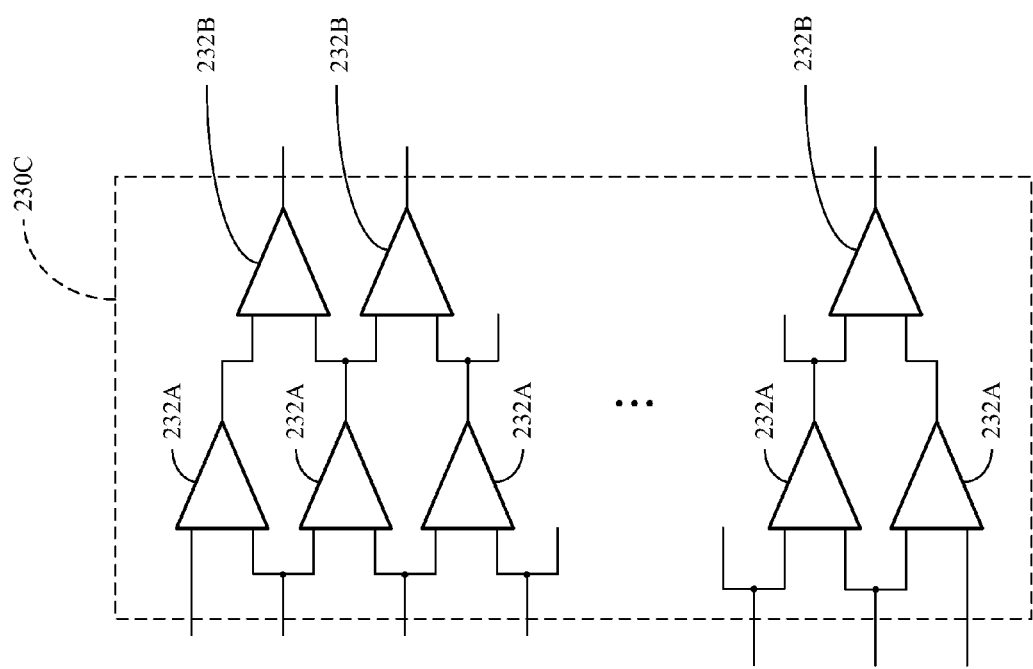

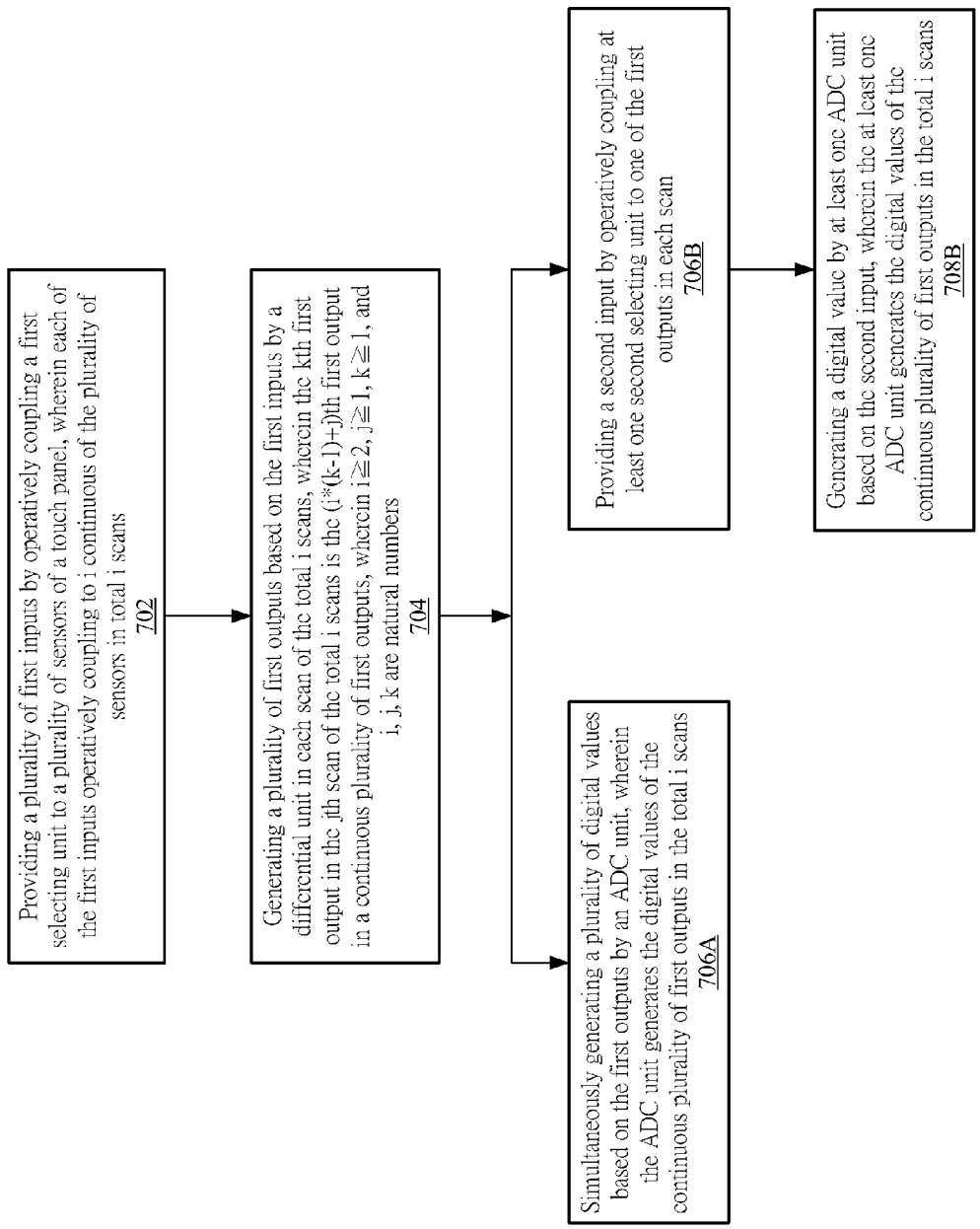

DEVICE AND METHOD FOR PARALLEL-SCANNING DIFFERENTIAL TOUCH DETECTION

CROSS REFERENCE TO RELATED APPLICATIONS

This application is a continuation of U.S. patent application Ser. No. 12/901,896, filed on Oct. 11, 2010, which claims the benefit of U.S. Provisional Application No. 61/298,252, filed on Jan. 26, 2010, Provisional Application No. 61/298,243, filed on Jan. 26, 2010 and U.S. Provisional Application No. 61/250,051, filed on Oct. 9, 2009, which is herein incorporated by reference for all intents and purposes.

BACKGROUND OF THE INVENTION

1. Field of the Invention

The present invention relates to a method and device for touch detection, and more particularly, to a method and device for parallel-scanning differential touch detection.

2. Description of the Prior Art

Referring to FIG. 1A, a schematic diagram depicting conventional touch detecting device 100. Display 110 is disposed under touch panel 120. Touch panel 120 has a plurality of first axial wires 122 and a plurality of second axial wires 124. First and second axial wires 122 and 124 are operatively coupled to driving/detecting unit 130. In this device, display 110 and touch panel 120 are integrated together in a conventional manner, and touch panel 120 consists of a plurality of layers that include a first layer of wires (not shown) having first axial wires 122 and a second layer of wires (not shown) having second axial wires 124. First and second axial wires 122 and 124 are parallel and electrical isolated from each other, and the first and second layers of wires are stacked onto and electrically isolated from each other. This part of the structure is well known in the art, and will not be further explained.

When touch detection device 100 is operating, driving/detecting unit 130 drives first or second axial wires 122 or 124 and detects variations in voltage, current or capacitance thereof to determine possible touch points. However, when examining the relationship between display 110 and touch panel 120 along cross-sectional line AA', some noises can be found between them, as shown in FIG. 1B. In FIG. 1B, there are noises of stray capacitances between first axial wires 122 (only the first axial wires are described herein for illustration purposes) and display 110, for example: $N_1$, $N_2$, $N_3$. When first axial wire 122 is being detected, the corresponding noises may reduce the sensitivity in detecting the first axial wire 122, or cause detection errors of touch points. Referring further to FIG. 1C, a schematic diagram depicting the variations in noises between touch panel 120 and display 110 under influences of different external forces is shown. Since the external forces exerted on touch panel 120 are not consistent, the distances between touch panel 120 and display 110 are not exactly the same. Therefore, noises $N_4$, $N_5$, $N_6$ of stray capacitances will also be different in magnitude. This increases the difficulty in detection of touch panel 120.

Accordingly, the present invention provides a method and device for parallel-scanning differential touch detection, which overcomes the issues about noises between a conventional display and a touch panel and increases accuracy in detection of touch detection devices.

SUMMARY OF THE INVENTION

The present invention discloses a device for parallel-scanning differential touch detection, which may include a differential unit and a first selecting unit. The differential unit generates a plurality of first outputs based on a plurality of first inputs in each scan of total i scans, wherein the kth first output in the jth scan of the total i scans is the (i*(k−1)+j)th first output in a continuous plurality of first outputs, wherein i≥2, j≥1, k≥1, and i, j, k are natural numbers. The first selecting unit is operatively coupled to a plurality of sensors (strips or lines) of a touch panel for providing the first inputs, wherein each of the first inputs is operatively coupled to one of i continuous of the plurality of sensors in the total i scans. The differential unit may include a plurality of subtractors or a plurality of dual-differential subtractors.

The present invention also discloses a device for parallel-scanning differential touch detection, which may include a differential unit for generating a plurality of first outputs based on a plurality of first inputs provided by a plurality of sensors of a touch panel in each scan of total i scans, wherein the kth first output in the jth scan of the total i scans is the (i*(k−1)+j)th first output in a continuous plurality of first outputs, wherein i≥2, j≥1, k≥1, and i, j, k are natural numbers. The differential unit may include a plurality of subtractors with a plurality of inputs connected in series or a plurality of dual-differential subtractors with a plurality of inputs connected in series.

The present invention also discloses a device for differential touch detection, which may include: a first selecting unit for simultaneously receiving signals of a plurality of adjacent first axial wires of a touch panel, and outputting the signals of these adjacent first axial wires according to a first selecting signal in a time-sharing manner $S_1$ times, wherein the first selecting unit includes a plurality of outputs and each output outputs next of the signals of the adjacent first axial wires each time after the first time of output, wherein $S_1 \geq 2$ and $S_1$ is a natural number; a first differential unit for receiving the signals of the adjacent first axial wires output from the first selecting unit, and subtracting two adjacent signals of the signals of the adjacent first axial wires from one another to obtain X results, wherein X≥1 and X is a natural number; and a detection controlling unit for receiving the X results and controlling the first selecting signal. The differential unit may include a plurality of subtractors or a plurality of dual-differential subtractors.

The present invention further discloses a method for parallel-scanning differential touch detection, which may include: providing a plurality of first inputs by operatively coupling a first selecting unit to a plurality of sensors of a touch panel, wherein each of the first inputs operatively coupling to i continuous of the plurality of sensors in total i scans; and generating a plurality of first outputs based on the first inputs by a differential unit in each scan of the total i scans, wherein the kth first output in the jth scan of the total i scans is the (i*(k−1)+j)th first output in a continuous plurality of first outputs, wherein i≥2, j≥1, k≥1, and i, j, k are natural numbers. The differential unit may include a plurality of subtractors or a plurality of dual-differential subtractors.

The present invention further discloses a method for parallel-scanning differential touch detection, which may include: generating a plurality of first outputs by a differential unit based on a plurality of first inputs provided by a plurality of sensors of a touch panel in each scan of total i scans, wherein the kth first output in the jth scan of the total i scans is the (i*(k−1)+j)th first output in a continuous plurality of first outputs, wherein i≥2, j≥1, k≥1, and i, j, k are natural numbers. The differential unit may include a plurality of subtractors with a plurality of inputs connected in series or a plurality of dual-differential subtractors with a plurality of inputs connected in series.

The present invention further discloses a method for differential touch detection, which may include: a first selecting unit simultaneously receiving signals of a plurality of adjacent first axial wires of a touch panel, and outputting the signals of these adjacent first axial wires according to a first selecting signal in a time-sharing manner $S_1$ times, wherein the first selecting unit includes a plurality of outputs and each output outputs next of the signals of the adjacent first axial wires each time after the first time of output, wherein $S_1 \geq 2$ and $S_1$ is a natural number; a first differential unit receiving the signals of the adjacent first axial wires output from the first selecting unit, and subtracting two adjacent signals of the signals of the adjacent first axial wires from one another to obtain X results, wherein $X \geq 1$ and X is a natural number; and a detection controlling unit receiving the X results and controlling the first selecting signal. The differential unit may include a plurality of subtractors or a plurality of dual-differential subtractors.

The above description is only an outline of the technical schemes of the present invention. Preferred embodiments of the present invention are provided below in conjunction with the attached drawings to enable one with ordinary skill in the art to better understand said and other objectives, features and advantages of the present invention and to make the present invention accordingly.

BRIEF DESCRIPTION OF THE DRAWINGS

The present invention can be more fully understood by reading the following detailed description of the preferred embodiments, with reference made to the accompanying drawings, wherein:

FIG. 3D is a schematic diagram depicting still another preferred differential unit of the present invention;

FIGS. 7A-7C are flowcharts illustrating three preferred method of the present invention.

DETAILED DESCRIPTION OF THE PREFERRED EMBODIMENTS

Figure 1A:
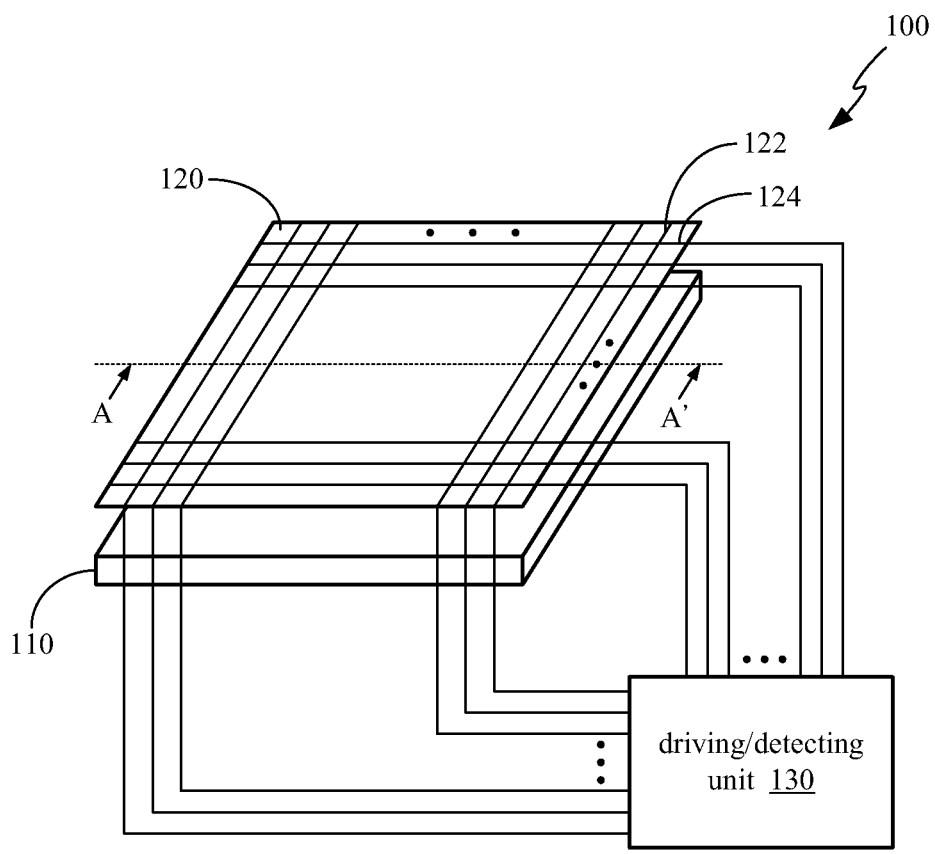
FIG. 1A is a schematic diagram depicting a conventional touch detecting device.
Figure 1B:
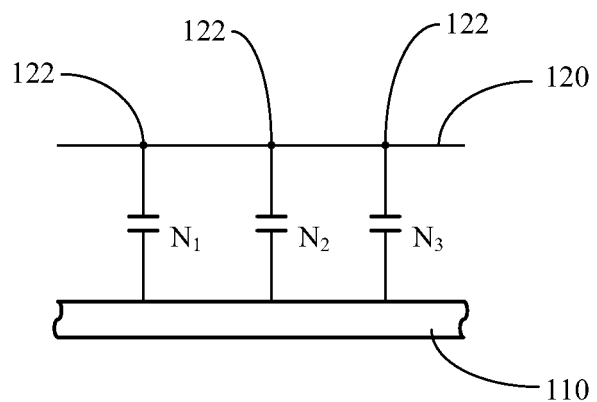
FIG. 1B is a schematic diagram showing the noises between a touch panel and a display.

Some embodiments of the present invention are described in details below. However, in addition to the descriptions given below, the present invention can be applicable to other embodiments, and the scope of the present invention is not limited by such, rather by the scope of the claims. Moreover, for better understanding and clarity of the description, some components in the drawings may not necessary be drawn to scale, in which some may be exaggerated relative to others, and irrelevant parts are omitted.

Figure 2A:
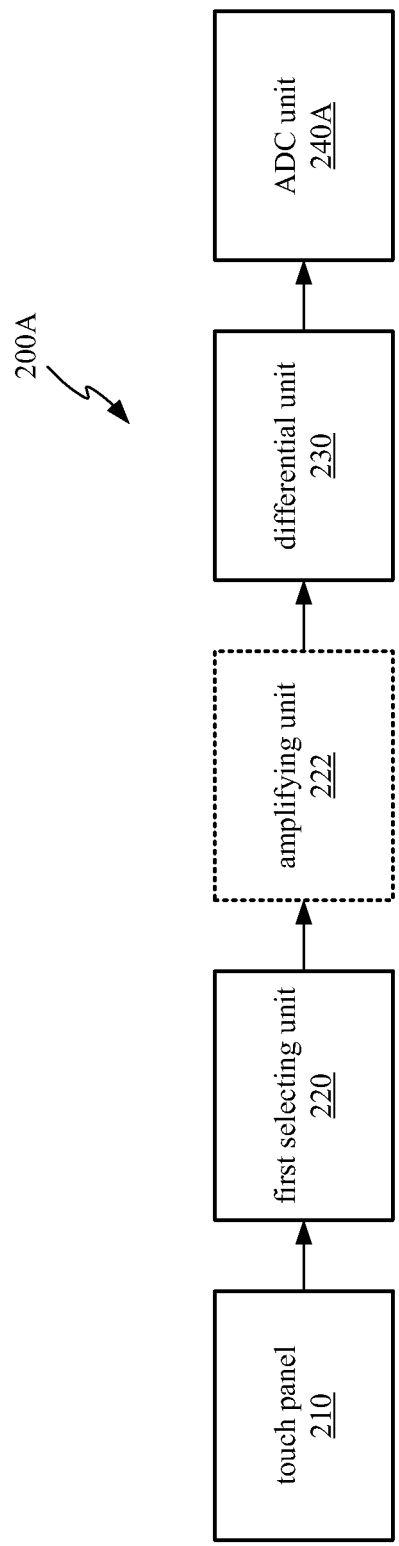
FIG. 2A is a block diagram of a preferred embodiment of the present invention.
Figure 2B:
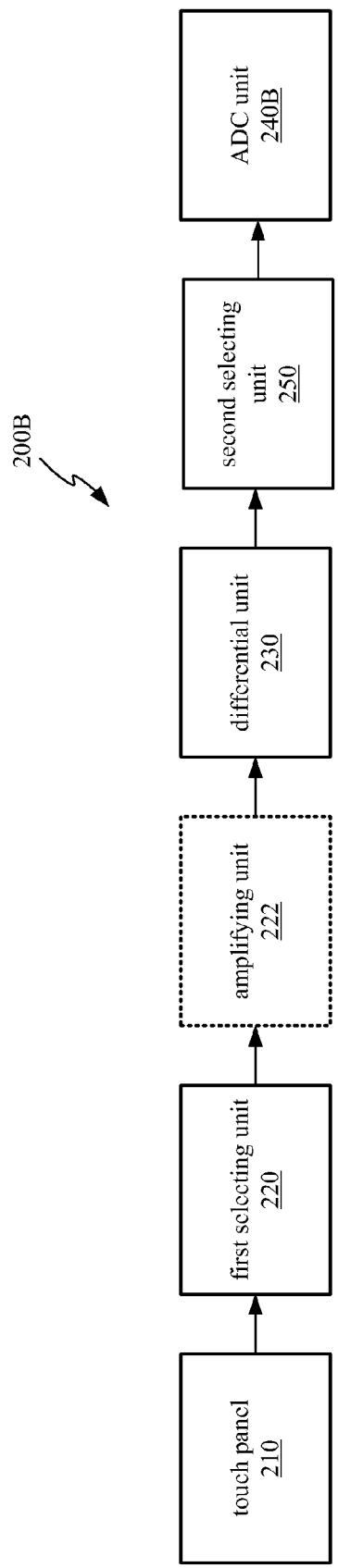
FIG. 2B is a block diagram of another preferred embodiment of the present invention.
Figure 3A:
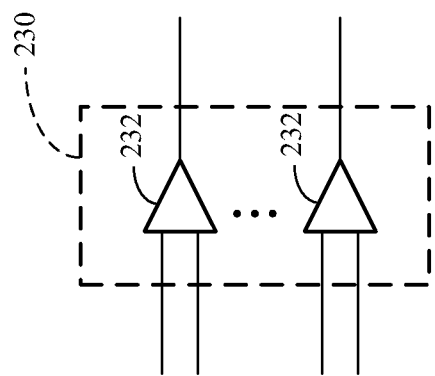
FIG. 3A is a schematic diagram depicting another preferred differential unit of the present invention.
Figure 3B:
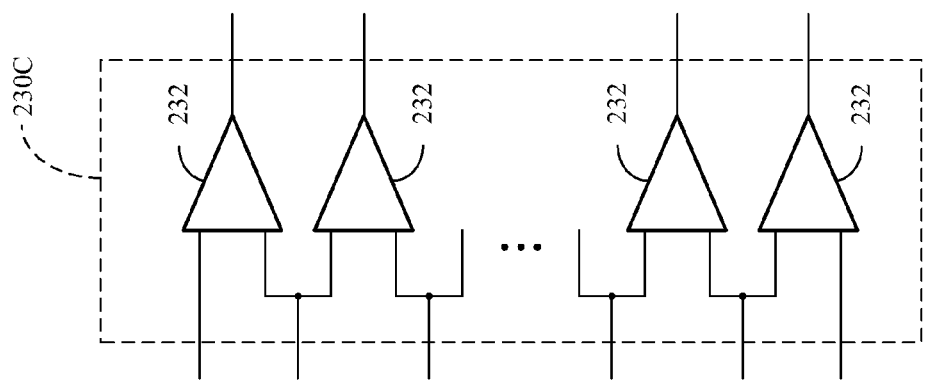
FIG. 3B is a schematic diagram depicting yet another preferred differential unit of the present invention.
Figure 3C:
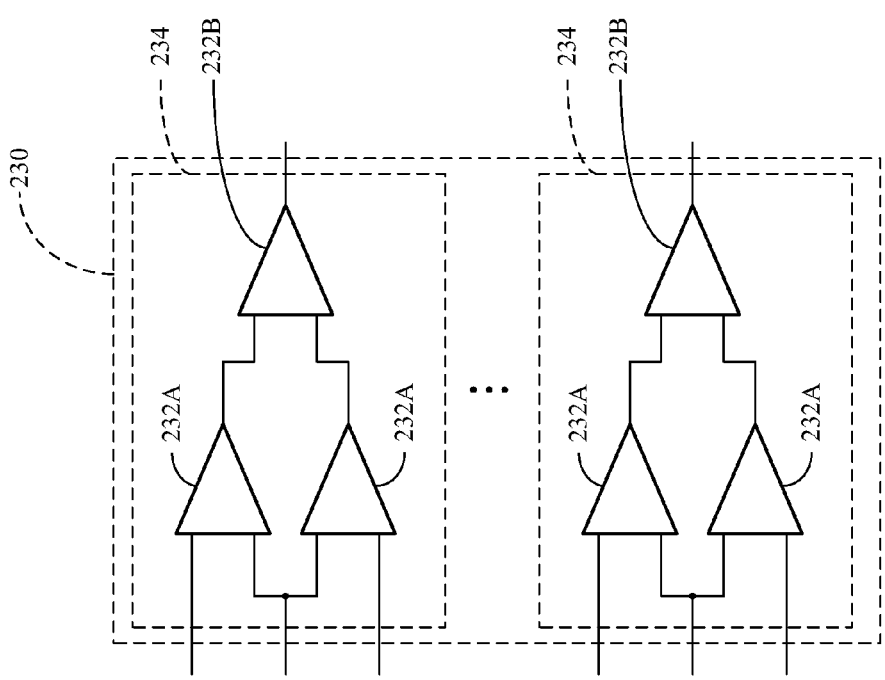
FIG. 3C is a schematic diagram depicting still another preferred differential unit of the present invention.

Referring to FIG. 2A, a block diagram of a preferred embodiment 200A of the present invention is shown. Differential unit 230 generates a plurality of first outputs according to a plurality of first inputs provided by touch panel 210 in each scan of total i scans (i.e. scanning of whole touch panel 210 is completed in i scans), wherein, the kth first output in the jth scan of the total i scans is the $(i*(k-1)+j)$th first output in a continuous plurality of first outputs, wherein $i \geq 2$, $j \geq 1$, $k \geq 1$, and i, j, k are natural numbers. First selecting unit 220 is operatively coupled to a plurality of sensors (or wires) of touch panel 210 to provide the first inputs to the differential unit 230, wherein each first input is operatively coupled to one of i continuous sensors of touch panel 210 in the total i scans. ADC (analog-to-digital converting) unit 240A generates a plurality of digital values simultaneously based on these first outputs, wherein ADC unit 240A generates digital values of the continuous plurality of first outputs in the total i scans. Referring to FIG. 2B, another block diagram of a preferred embodiment 200B of the present invention is shown. It is different from that of FIG. 2A in that one of the first outputs generated by differential unit 230 is operatively coupled via at least one second selecting unit 250 sequentially in each scan to provide a second output. At least one ADC unit 240B generates a digital value based on these second inputs, wherein at least one ADC unit 240B generates digital values of the continuous plurality of first inputs in the total i scans. In the two embodiments above, differential unit 230 includes a plurality of subtractors 232, such as those shown in FIG. 3A. The first inputs provided by first selecting unit 220 include plurality pairs of inputs. Each subtractor generates one of the first outputs based on one of the pairs of inputs. Thus, noises between the touch panel and the display can be reduced by cancelation between signals. In another preferred embodiment, differential unit 230 of the two embodiments includes a plurality dual-differential subtractor 234, as shown in FIG. 3C. Each dual-differential subtractor 234 further includes two first subtractors 232A and one second subtractor 232B, wherein the inputs of two first subtractors 232A are connected in series. Second subtractor 232B receives the outputs of two first subtractors 232A and generates one of the first outputs. The first inputs provided by first selecting unit 220 include a plurality set of three inputs (the tree input could be adjacent or not adjacent), and each dual-differential subtractor generates one of the first outputs based on one of the plurality set of three inputs, thereby eliminating different noises between the touch panel and the display caused by different exerted forces. In addition, in FIGS. 2A and 2B, amplifying unit 222 between first selecting unit 220 and differential unit 230 amplifies the first inputs provided by first selecting unit 220 to differential unit 230. This will be explained in details later.

Figure 2C:
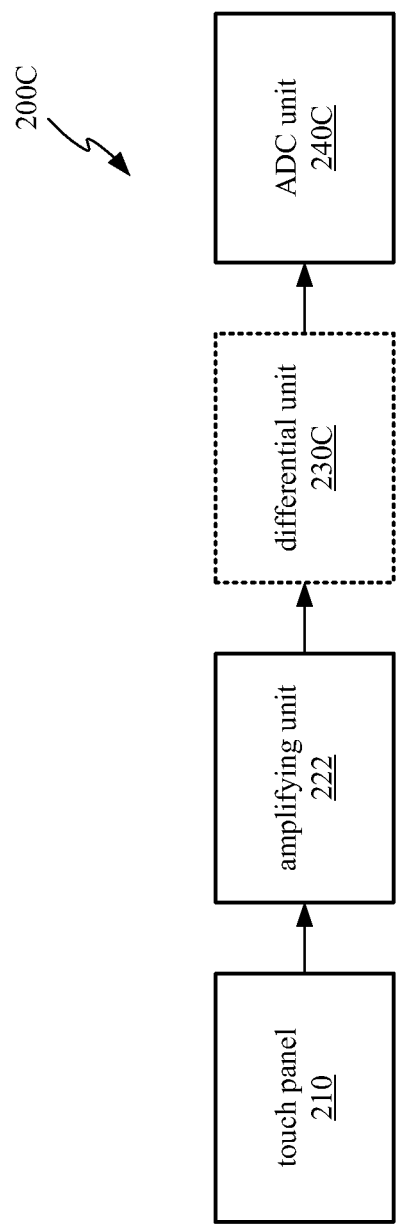
FIG. 2C is a block diagram of yet another preferred embodiment of the present invention.
Figure 2D:
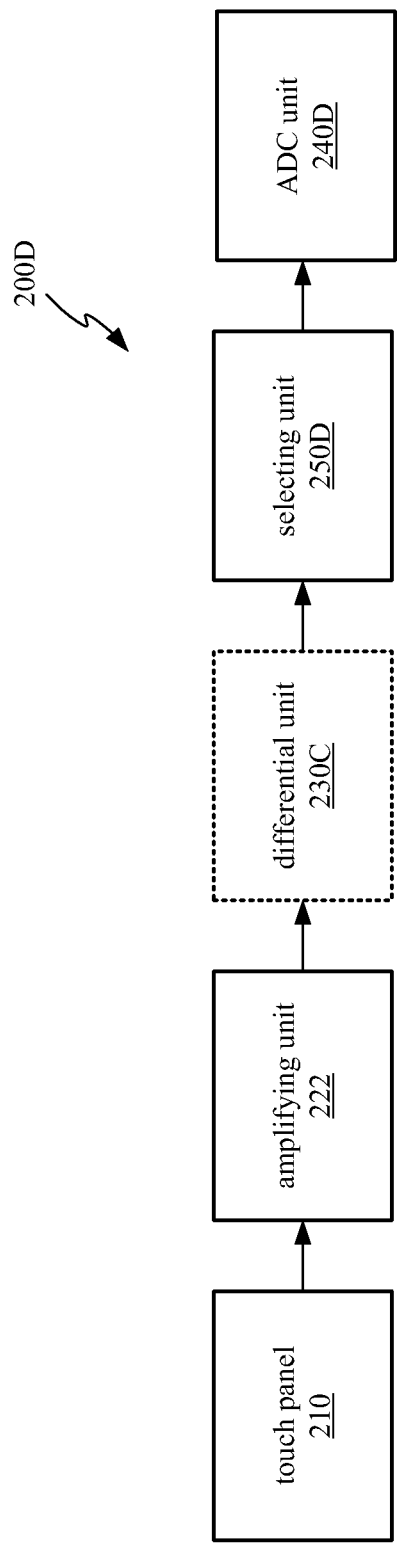
FIG. 2D is a block diagram of still another preferred embodiment of the present invention.

Referring to FIG. 2C, a block diagram of yet another preferred embodiment 200C of the present invention is shown. Differential unit 230 is directly coupled (or via amplifying unit 222) to touch panel 210, and generates a plurality of first outputs based on a plurality of first inputs provided by a plurality of sensors (wires) of touch panel 210 in each scan of total i scans, wherein, the kth first output in the jth scan of the total i scans is the (i*(k−1)+j)th first output in a continuous plurality of first outputs, wherein i≥2, j≥1, k≥1, and i, j, k are natural numbers. ADC (analog-to-digital converting) unit 240C generates a plurality of digital values simultaneously based on these first outputs, wherein ADC unit 240C generates digital values of the continuous plurality of first outputs in the total i scans. Referring to FIG. 2D, still another block diagram of a preferred embodiment 200D of the present invention is shown. This is different from that of FIG. 2C in that one of the first outputs generated by differential unit 230C is operatively coupled via selecting unit 250D sequentially in each scan to provide a second output. ADC unit 240D generates a digital value based on these second inputs, wherein ADC unit 240D generates digital values of the continuous plurality of first inputs in the total i scans. In the two embodiments above, differential unit 230C includes a plurality of subtractors 232, and the inputs of these subtractors 232 are connected in series, as shown in FIG. 3B. The first inputs provided by touch panel 210 includes plurality pairs of inputs, and each subtractor generates one of the first outputs based on one of the plurality of pairs of inputs. Thus, noises between the touch panel and the display can be reduced by cancelation between signals. In another preferred embodiment, differential unit 230C of the two embodiments includes a plurality dual-differential subtractor 234, as shown in FIG. 3D, the inputs of a plurality of first subtractors 232A are connected in series, and a plurality of second subtractors 232B correspondingly receive outputs of these first subtractors 232A, and the inputs of these second subtractors 232B are also connected in series. The first inputs provided by touch panel 210 include a plurality set of three inputs (the tree input could be adjacent or not adjacent), and each dual-differential subtractor generates one of the first outputs based on one of the plurality set of three inputs, thereby eliminating different noises between the touch panel and the display caused by different exerted forces.

Figure 2E:
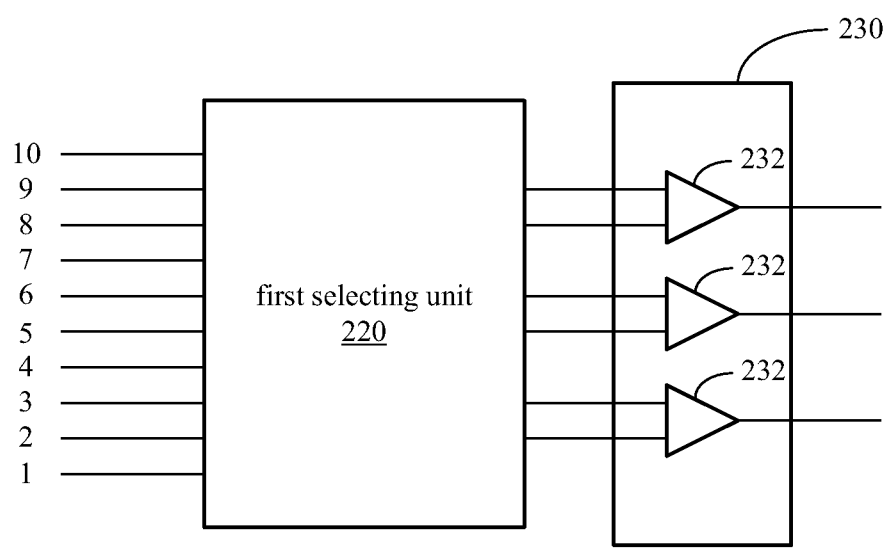
FIG. 2E is a schematic diagram depicting the relationship between a first selecting unit and a differential unit of a preferred embodiment of the present invention.
Figure 2F:
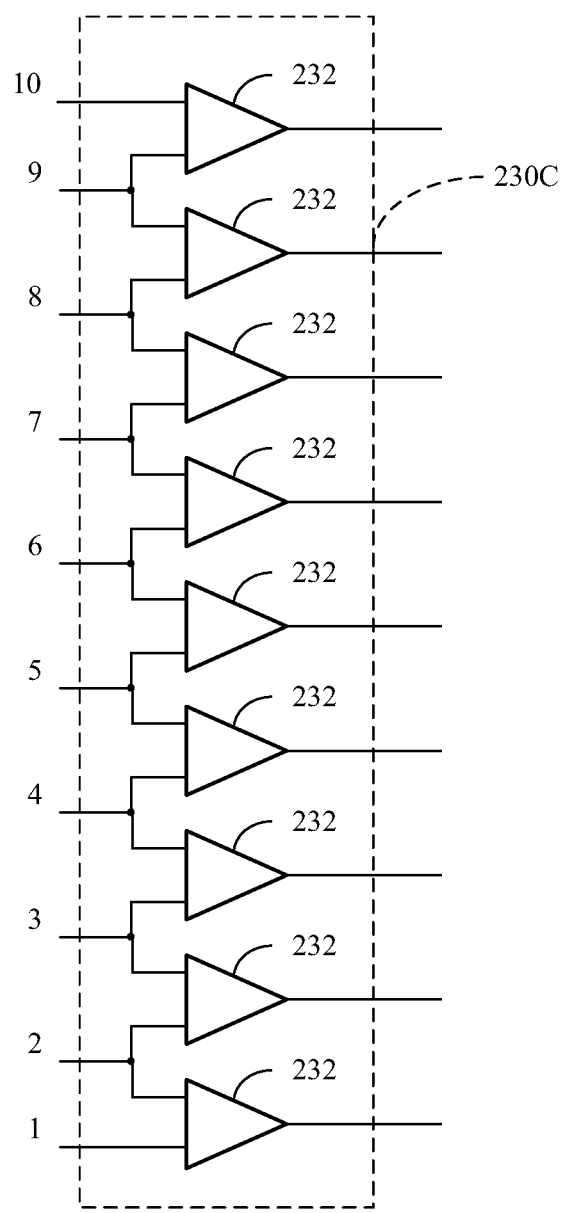
FIG. 2F is a schematic diagram depicting a preferred differential unit of the present invention.

The meaning of "the kth first output in the jth scan of the total i scans is the (i*(k−1)+j)th first output in a continuous plurality of first outputs" mentioned with respect to differential unit 230 is first explained. Referring to FIG. 2E, an embodiment is depicted, in which 10 sensors are output in a time-sharing manner via first selecting unit 220 to differential unit 230 having three subtractors 232. This embodiment is described merely for illustration purpose, and the present invention is not limited thereto. In the convention touch detection technique, signals of two adjacent sensors among the ten sensors are subtracted to obtain 9 continuous results that eliminates noises between the display and the touch panel (requiring 9 subtractors, assuming the first result is 1st–2nd, the second result is 2nd–3rd, the third result is 3rd–4th, . . . , the eighth result is 8th–9th and the ninth result is 9th–10th). In the present embodiment, scanning is divided into three times (three subtractors), the results of the first scan are 1st–2nd, 4th–5th and 7th–8th; the results of the second scan are 2nd–3rd, 5th–6th and 8th–9th; and the results of the third scan are 3rd–4th, 6th–7th and 9th–10th. Thus, in the third (j=3) scan of total three (i=3) scans, the first (k=1) output is the third output (3*(1−1)+3) in the continuous plurality of outputs (i.e. the third of the 9 continuous results, 3rd–4th). Furthermore, in the second (j=2) scan of total three (i=3) scans, the third (k=3) output is the eighth output (3*(3−1)+2) in the continuous plurality of outputs (i.e. the eighth of the 9 continuous results, 8th–9th). Referring to FIG. 2F, an embodiment is depicted, in which 10 sensors are output via differential unit 230 having nine subtractors 232, wherein the inputs of nine subtractors 232 are connected in series. This embodiment is described merely for illustration purpose, and the present invention is not limited thereto. In this embodiment, assuming scanning is divided into two times, the results of the first scan are 1st–2nd, 3rd–4th, 5th–6th, 7th–8th, 9th–10th; and the results of the second scan are 2nd–3rd, 4th–5th, 6th–7th, 8th–9th, 10th–11th. Therefore, in the first scan (j=1) of total two (i=2) scans, the second (k=2) output is the third output (2*(2−1)+1) in the continuous plurality of outputs (i.e. the third of the 9 continuous outputs, 3rd–4th). As another example, in the second scan (j=2) of total two (i=2) scans, the fourth (k=4) output is the eighth output (2*(4−1)+2) in the continuous plurality of outputs (i.e. the eighth of the 9 continuous outputs, 8th–9th). This is what it means by "the kth first output in the jth scan of the total i scans is the (i*(k−1)+j)th first output in a continuous plurality of first outputs" mentioned with respect to differential unit 230.

Figure 1C:
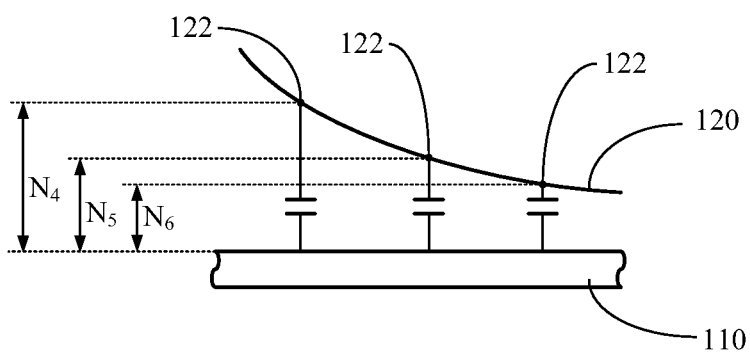
FIG. 1C is a schematic diagram depicting the variations in noises between a touch panel and a display under influences of different external forces.
Figure 3E:
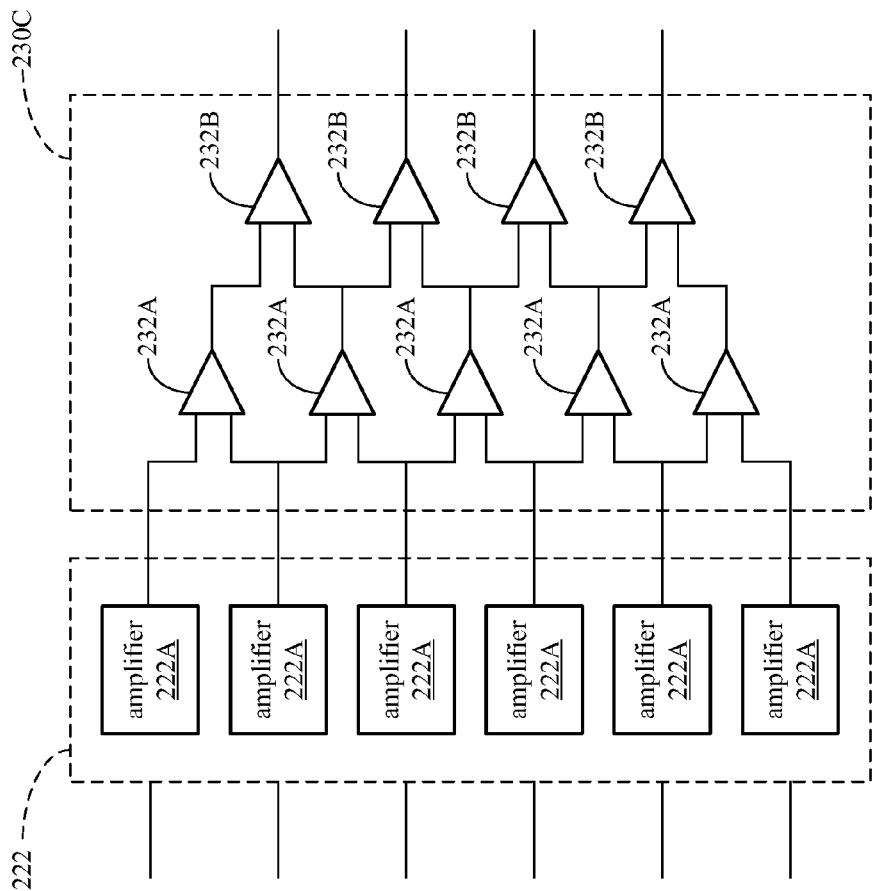
FIG. 3E is a schematic diagram depicting an amplifying unit and a differential unit of a preferred embodiment of the present invention.

Referring to FIG. 3E, a schematic diagram depicting an amplifying unit 222 and a differential unit 230C according to a preferred embodiment of the present invention is shown, in which 6-bit inputs are used to illustrate the structural and connection relationships between the two elements, but the present invention is not limited to this. Each input of differential unit 230C is coupled to an amplifier 222A of amplifying unit 222. In this embodiment, differential unit 230C includes five first subtractors 232A and four second subtractors 232B. The inputs to these five first subtractors 232A are connected in series and thus forming six inputs. The inputs to the four second subtractors 232B are also connected in series and thus forming five inputs that respectively receive the outputs of the five first subtractors 232A, thereby forming four sets of dual-differential subtractors. When this embodiment is in operation, the output of the first second subtractor 232B or the first set of dual-differential subtractors (assuming the order increases from bottom to top) will be ((1st–2nd)–(2nd–3rd)) (assuming the order of inputs also increases from bottom to top); the output of the second set of dual-differential subtractors will be ((2nd–3rd)–(3rd–4th)) and so on, and the output of the fourth set of dual-differential subtractors will be ((4th–5th)–(5th–6th)). In other words, the output of each set of dual-differential subtractors is the difference generated by its second subtractor 232B of two outputs (first difference and second difference) from two corresponding first subtractors 232A. In this way, the effect of differences noises generated between the touch panel and the display due to different exerted forces can be eliminated using dual-differential processing of signals from a sensor to be scanned and two adjacent sensors at either side of it. For example, referring to FIG. 1C again, when the slope of bending of touch panel 120 due to external forces is larger, then the difference between $N_4-N_5$ will almost equal the difference between $N_5-N_6$. Thus, by subtracting these two differences from one another, the noises between the touch panel and the display can be eliminated.

Figure 4:
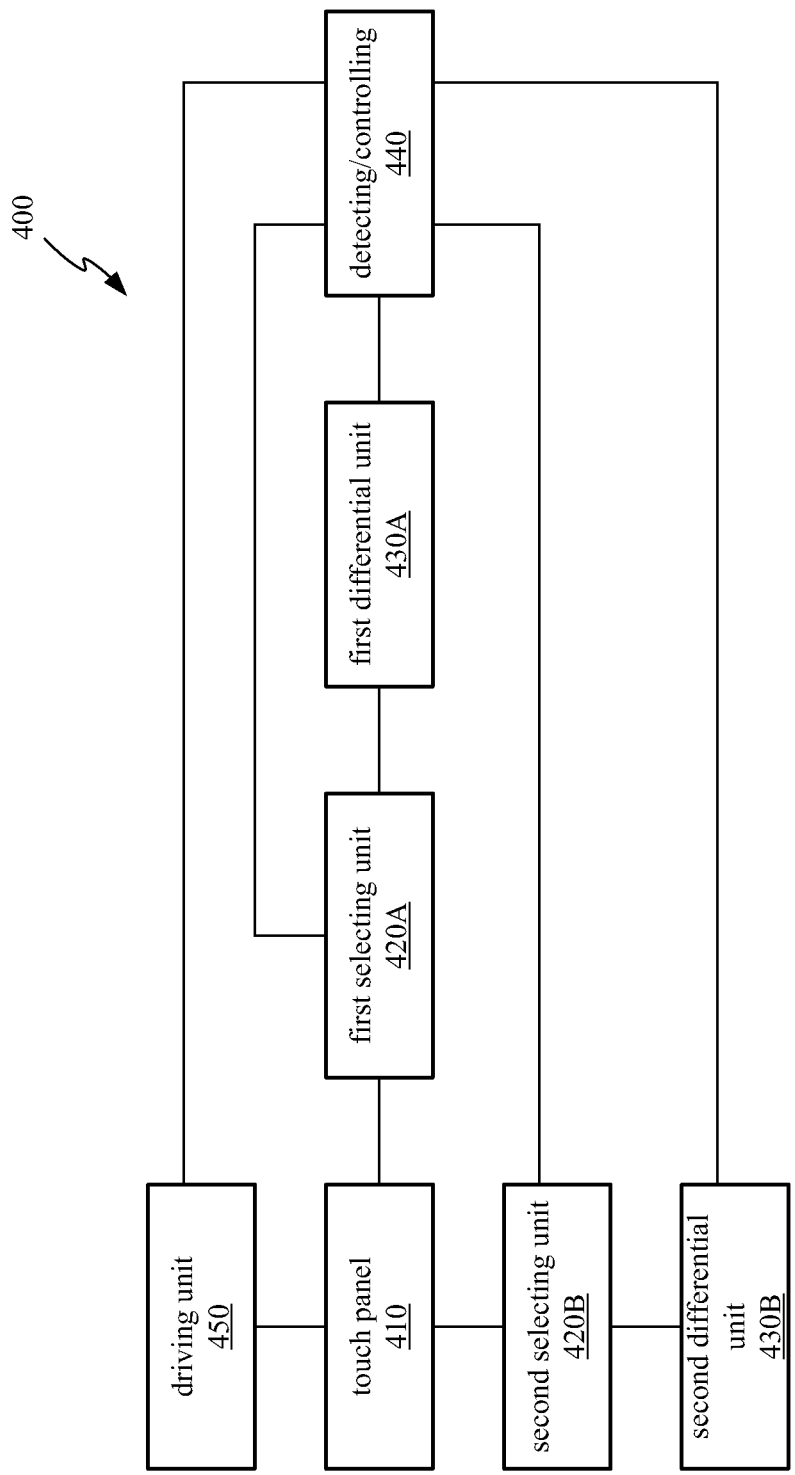
FIG. 4 is a block diagram of yet another preferred embodiment of the present invention.

Referring to FIG. 4, a schematic block diagram depicting a preferred embodiment 400 of the present invention is shown. A first selecting unit 420A simultaneously receives signals of a plurality of adjacent first axial wires, and outputs signals of these adjacent first axial wires according to a first selecting signal in a time-sharing manner $S_1$ times, wherein first selecting unit 420A has a plurality of outputs and each output outputs a signal of the next one of these adjacent first axial wires each time after the first time of output, wherein $S_1 \geq 2$ and $S_1$ is a natural number. A first differential unit 430A receives the signals of these adjacent first axial wires output by first selecting unit 420A, and subtracts two adjacent signals of these adjacent first axial wires from one another to filter out the noises between the display and the touch panel and obtain X results, where $X \geq 1$ and X is a natural number. A detecting/controlling unit 440 receives these X results, and controls the first selecting signal for controlling the output of the signals of these adjacent first axial wires in a time-sharing manner $S_1$ times. A driving unit 450 controlled by detecting/controlling unit 440 controls and drives touch panel 410. A second selecting unit 420B simultaneously receives signals of a plurality of adjacent second axial wires, and outputs signals of these adjacent second axial wires according to a second selecting signal in a time-sharing manner $S_2$ times, wherein second selecting unit 420B has a plurality of outputs and each output outputs a signal of the next one of these adjacent second axial wires each time after the first time of output, wherein $S_2 \geq 2$ and $S_2$ is a natural number. A second differential unit 430B receives the signals of these adjacent second axial wires output by second selecting unit 420B, and subtracts two adjacent signals of these adjacent second axial wires from one another to filter out the noises between the display and the touch panel and obtain Y results, where $Y \geq 1$ and Y is a natural number. Detecting/controlling unit 440 receives these Y results, and controls the second selecting signal for controlling the output of the signals of these adjacent second axial wires in a time-sharing manner $S_2$ times. In this embodiment, first differential unit 430A may include a plurality of first subtractors shown by the structure of FIG. 3A, or a plurality of first dual-differential subtractors shown by the structure of FIG. 3C; while second differential unit 430B may include a plurality of third subtractors shown by the structure of FIG. 3A, or a plurality of second dual-differential subtractors shown by the structure of FIG. 3C

Figure 5A:
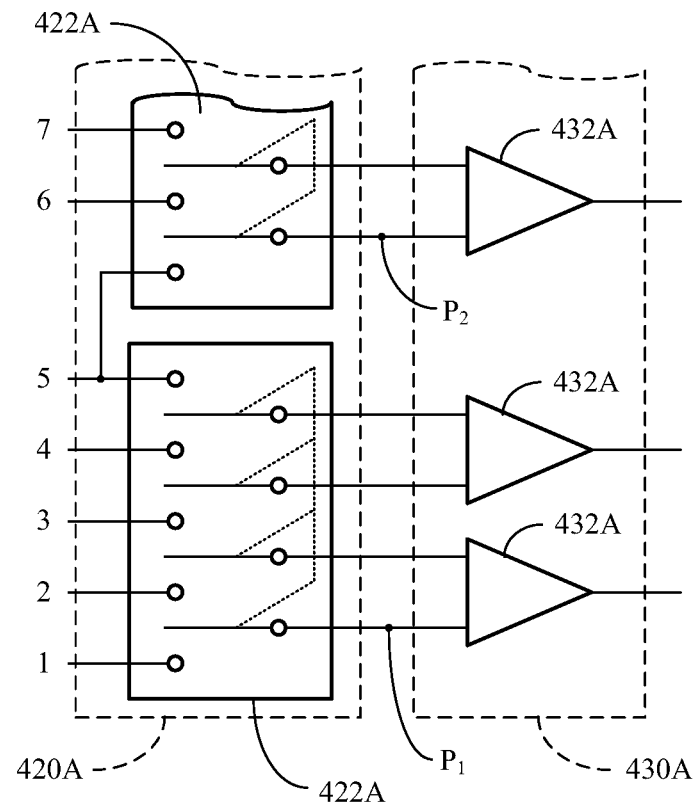
FIGS. 5A-5D are schematic diagrams depicting four preferred first selecting units and first differential units of the present invention.

Referring to FIG. 5A, a schematic diagram depicting a first selecting unit 420A and a first differential unit 430A according to a preferred embodiment of the present invention is shown. In FIG. 5A, first selecting unit 420A includes a plurality of electronically actuated switches 422A with $n_1$-bit output in $m_1$ segments, wherein $m_1 \geq 2$, $n_1 \geq 1$ and $m_1$ and $n_1$ are natural numbers. In this embodiment, $m_1$ is 2 and $n_1$ is 4 (for illustration only). Thus, when first selecting unit 420A outputs for the first time, the outputs are taken from 1st, 2nd, 3rd, 4th, 5th, and 6th inputs, and thus the outputs of first differential unit 430A are (1st−2nd), (3rd−4th) and (5th−6th); in the second time, the outputs are taken from 2nd, 3rd, 4th, 5th, 6th and 7th inputs, and thus the outputs of first differential unit 430A are (2nd−3rd), (4th−5th) and (6th−7th). For outputs $P_1$ and $P_2$ of first selecting unit 420A, the corresponding switches are switched between 1 and 2 and between 5 and 6, respectively. That is, for the first time, signals of 1st and 5th inputs are used, and for the next time, signals of 2nd and 6th inputs are used.

Figure 5B:
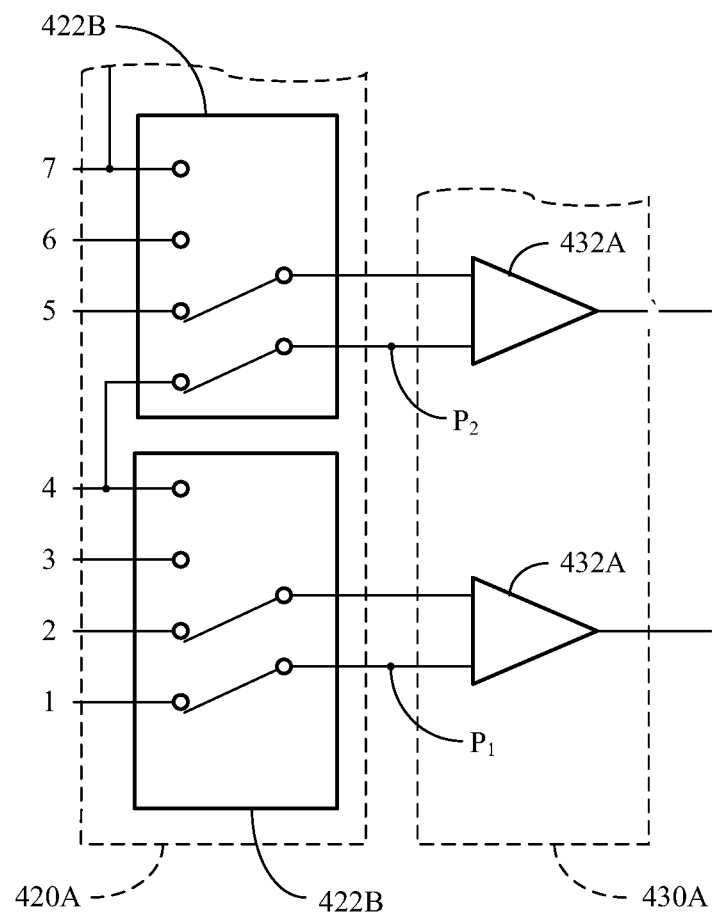

Referring to FIG. 5B, a schematic diagram depicting a first selecting unit 420A and a first differential unit 430A according to another preferred embodiment of the present invention is shown. In FIG. 5B, first selecting unit 420A includes a plurality of data shifters 422B with $m_2$ inputs and $n_2$ outputs, wherein $m_2 \geq 2$, $n_2 \geq 1$, $m_2 > n_2$ and $m_2$ and $n_2$ are natural numbers. In this embodiment, $m_2$ is 4 and $n_2$ is 2 (for illustration only). Thus, when first selecting unit 420A outputs for the first time, the outputs are taken from 1st, 2nd, 4th, and 5th inputs, and thus the outputs of first differential unit 430A are (1st−2nd) and (4th−5th); in the second time, the outputs are taken from 2nd, 3rd, 5th and 6th inputs, and thus the outputs of first differential unit 430A are (2nd−3rd) and (5th−6th); in the third time, the outputs are taken from 3rd, 4th, 6th and 7th inputs, and thus the outputs of first differential unit 430A are (3rd−4th) and (6th−7th). For outputs $P_1$ and $P_2$ of first selecting unit 420A, the corresponding switches are switched between 1, 2 and 3, and between 4, 5 and 6, respectively. That is, for the first time, signals of 1st and 4th inputs are used, and then, signals of 2nd and 5th inputs are used, thereafter, signals of 3rd and 6th inputs are used.

Figure 5C:
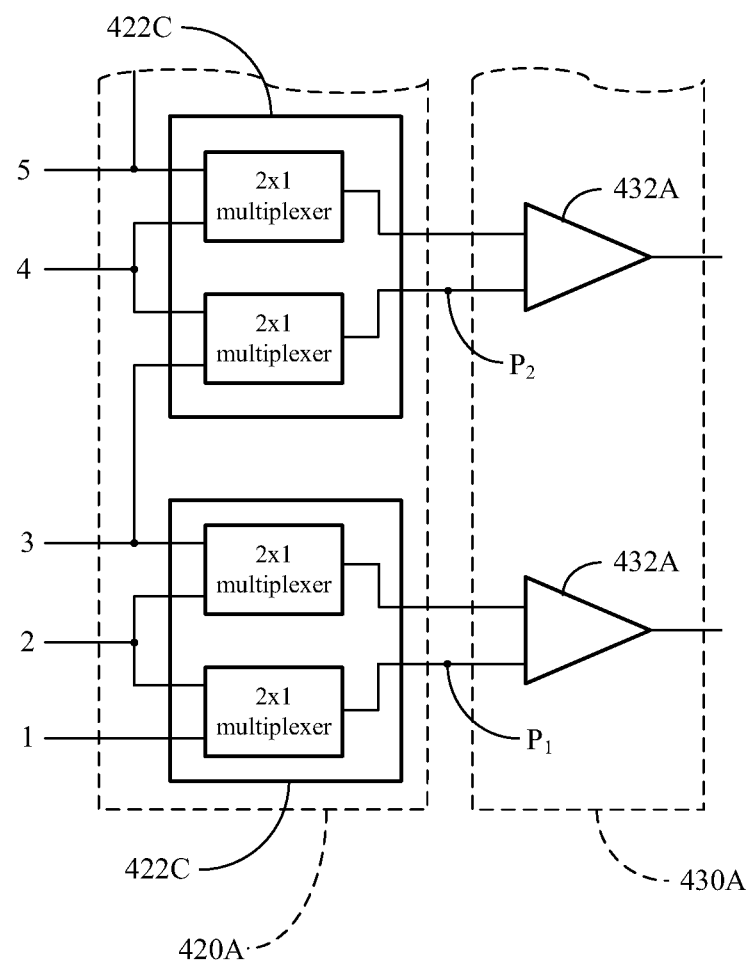

Referring to FIG. 5C, a schematic diagram depicting a first selecting unit 420A and a first differential unit 430A according to yet another preferred embodiment of the present invention is shown. In FIG. 5C, first selecting unit 420A includes a plurality of $m_3$-to-1 multiplexers 422C, wherein $m_3 \geq 2$ and $m_3$ is a natural number. In this embodiment, $m_3$ is 2 and multiplexers 422C are 2 sets of 2×1 multiplexers (for illustration only). Thus, when first selecting unit 420A outputs for the first time, the outputs are taken from 1st, 2nd, 3rd and 4th inputs, and thus the outputs of first differential unit 430A are (1st−2nd) and (3rd−4th); in the second time, the outputs are taken from 2nd, 3rd, 4th and 5th inputs, and thus the outputs of first differential unit 430A are (2nd−3rd) and (4th−5th). For outputs $P_1$ and $P_2$ of first selecting unit 420A, the corresponding switches are switched between 1 and 2 and between 3 and 4, respectively. That is, for the first time, signals of 1st and 3rd inputs are used, and for the next time, signals of 2nd and 4th inputs are used.

Figure 5D:
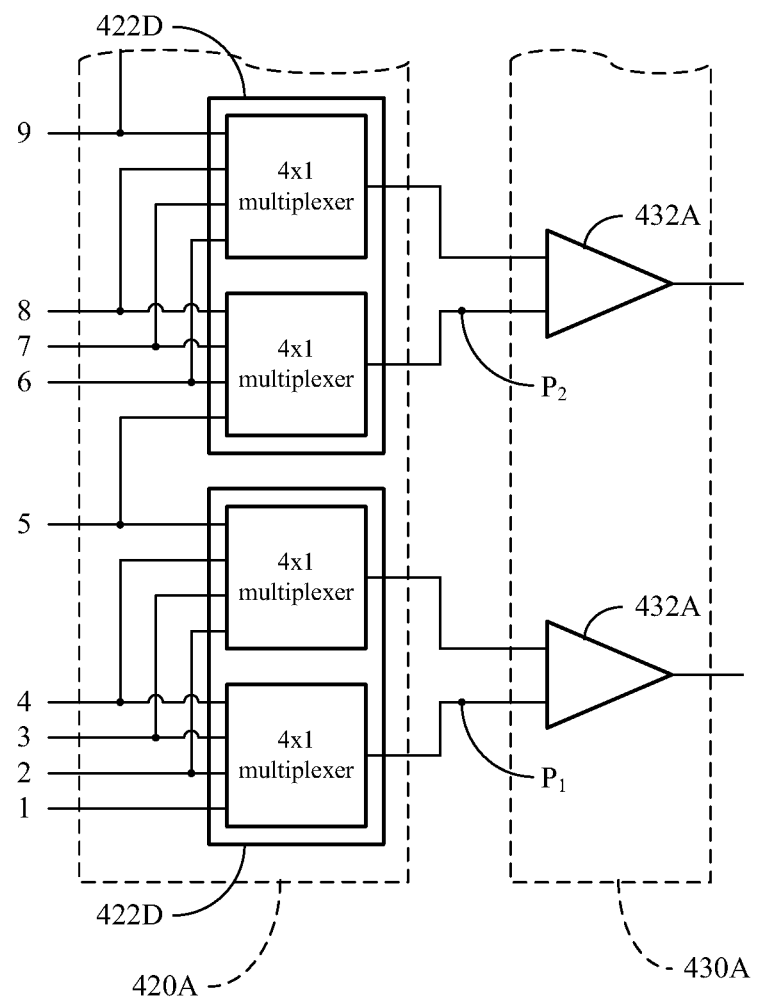
Figure 6A:
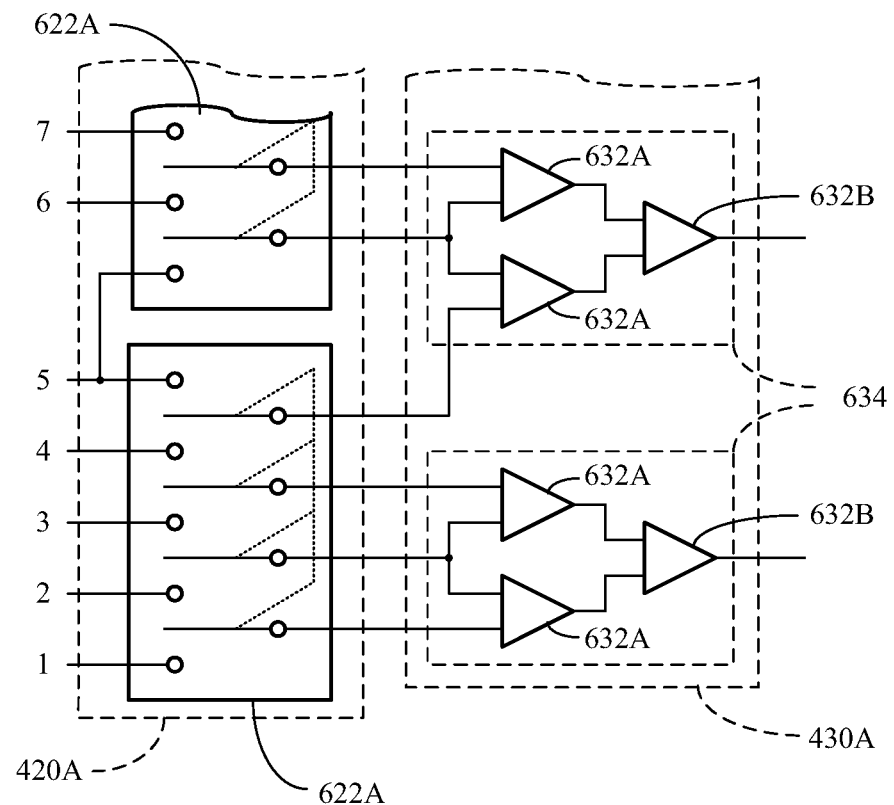
FIGS. 6A-6B are schematic diagrams depicting two other preferred first selecting units and first differential units of the present invention.

Referring to FIG. 5D, a schematic diagram depicting a first selecting unit 420A and a first differential unit 430A according to still another preferred embodiment of the present invention is shown. In FIG. 5C, first selecting unit 420A includes a plurality of $m_3$-to-1 multiplexers 422D, wherein $m_3 \geq 4$ and multiplexers 422D are 2 sets of 4×1 multiplexers (for illustration only). Thus, when first selecting unit 420A outputs for the first time, the outputs are taken from 1st, 2nd, 5th and 6th inputs, and thus the outputs of first differential unit 430A are (1st−2nd) and (5th−6th); in the second time, the outputs are taken from 2nd, 3rd, 6th and 7th inputs, and thus the outputs of first differential unit 430A are (2nd−3rd) and (6th−7th); in the third time, the outputs are taken from 3rd, 4th, 7th and 8th inputs, and thus the outputs of first differential unit 430A are (3rd−4th) and (7th−8th); in the fourth time, the outputs are taken from 4th, 5th, 8th and 9th inputs, and thus the outputs of first differential unit 430A are (4th−5th) and (8th−9th). For outputs $P_1$ and $P_2$ of first selecting unit 420A, the corresponding switches are switched between 1, 2, 3 and 4, and between 5, 6, 7 and 8, respectively. That is, for the first time, signals of 1st and 5th inputs are used, and for the next time, signals of 2nd and 6th inputs are used, and then, signals of 3rd and 7th inputs are used, and then, signals of 4th and 8th inputs are used Referring to FIG. 6A, a schematic diagram depicting a first selecting unit 420A and a first differential unit 430A according to still another preferred embodiment of the present invention is shown. In FIG. 6A, first selecting unit 420A includes a plurality of electronically actuated switches 622A with $n_7$-bit outputs in $m_7$ segments, wherein $m_7 \geq 3$, $n_7 \geq 3$ and $m_7$ and $n_7$ are natural numbers. In this embodiment, $m_7$ is 3 and $n_7$ is 4 (for illustration only). Thus, when first selecting unit 420A outputs for the first time, the outputs are taken from 1st, 2nd, 3rd, 4th, 5th, and 6th inputs, and thus the outputs of first differential unit 430A are ((1st−2nd)−(2nd−3rd)) and ((4th−5th)−(5th−6th)); in the second time, the outputs are taken from 2nd, 3rd, 4th, 5th, 6th and 7th inputs, and thus the outputs of first differential unit 430A are ((2nd−3rd)−(3rd−4th)) and ((5th−6th)−(6th−7th)); in the third time, the outputs are taken from 3rd, 4th, 5th, 6th, 7th and 8th inputs, and thus the outputs of first differential unit 430A are ((3rd−4th)−(4th−5th)) and ((6th−7th)−(7th−8th)).

Figure 6B:
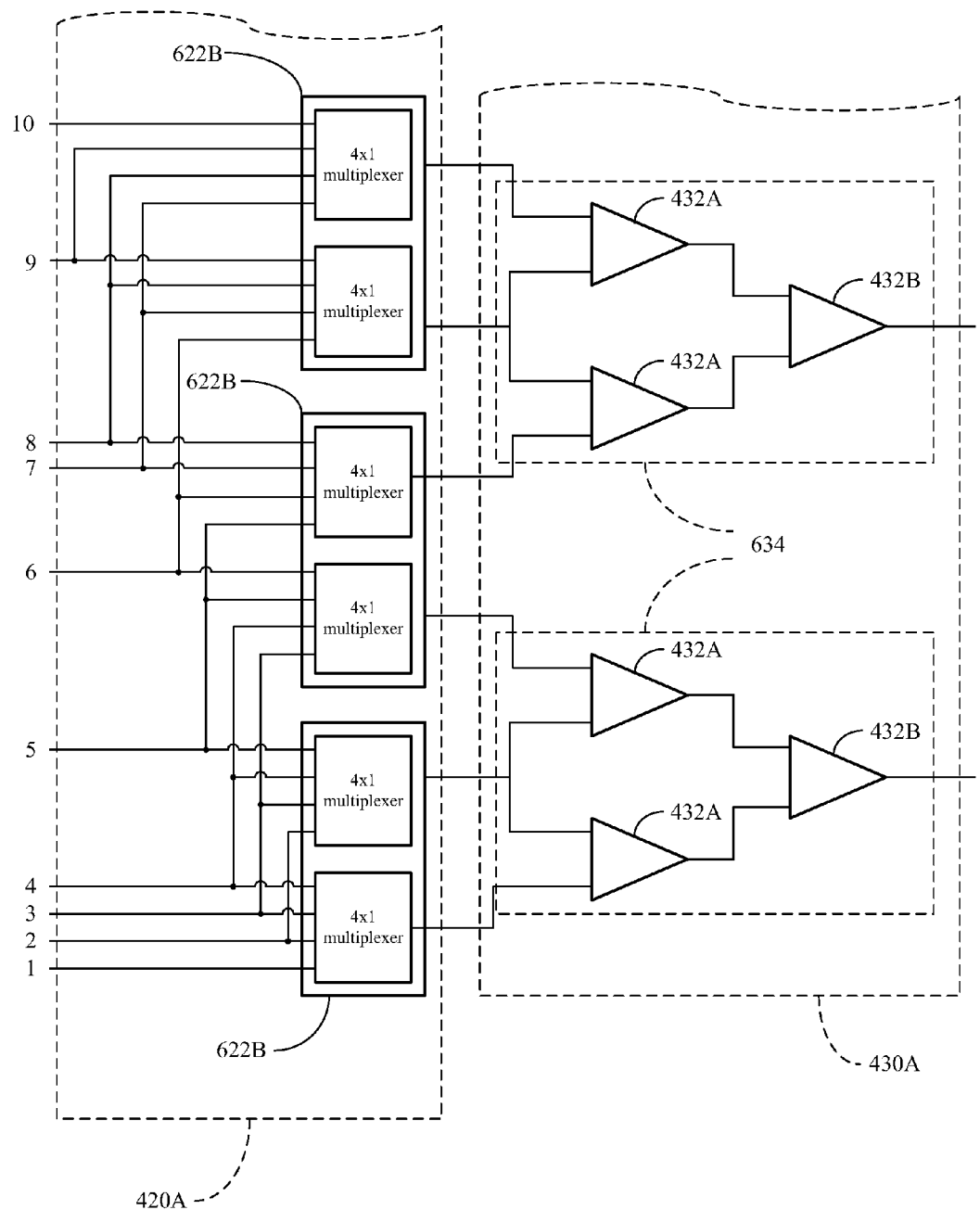

Referring to FIG. 6B, a schematic diagram depicting a first selecting unit 420A and a first differential unit 430A according to still another preferred embodiment of the present invention is shown. In FIG. 6B, first selecting unit 420A includes a plurality of $m_8$-to-1 multiplexers 622B, wherein $m_8 \geq 3$ and $m_8$ is a natural number. In this embodiment, $m_8$ is 4 and multiplexers 622B are 2 sets of 4×1 multiplexers (for illustration only). Thus, when first selecting unit 420A outputs for the first time, the outputs are taken from 1st, 2nd, 3rd, 5th, 6th and 7th inputs, and thus the outputs of first differential unit 430A are ((1st−2nd)−(2nd−3rd)) and ((5th−6th)−(6th−7th)); in the second time, the outputs are taken from 2nd, 3rd, 4th, 6th, 7th and 8th inputs, and thus the outputs of first differential unit 430A are ((2nd−3rd)−(3rd−4th)) and ((6th−7th)−(7th−8th)); in the third time, the outputs are taken from 3rd, 4th, 5th, 7th, 8th and 9th inputs, and thus the outputs of first differential unit 430A are ((3rd−4th)−(4th−5th)) and ((7th−8th)−(8th-9th)); in the fourth time, the outputs are taken from 4th, 5th, 6th, 8th, 9th and 10th inputs, and thus the outputs of first differential unit 430A are ((4th−5th)−(5th−6th)) and ((8th−9th)−(9th−10th)).

The above six embodiment illustrate the corresponding design relationships between first selecting unit 420A and first differential unit 430A; one with ordinary skill in the art can make apparent changes to those according to the disclosure herein. Similarly, the corresponding design relationships between second selecting unit 420B and second differential unit 430B may also be those shown above, and will not be repeated.

Referring to FIG. 7A, a flowchart illustrating a preferred method of the present invention is shown. In step 702, a plurality of first inputs is provided by operatively coupling a first selecting unit to a plurality of sensors of a touch panel, wherein each first input is operatively coupled to one of i continuous sensors in total i scans. In step 704, a plurality of first outputs are generated by a differential unit based on the first inputs in each scan of the total i scans, wherein the kth first output in the jth scan of the total i scans is the (i*(k−1)+j)th first output in a continuous plurality of first outputs, wherein $i \geq 2$, $j \geq 1$, $k \geq 1$, and i, j, k are natural numbers. In step 706A, a plurality of digital values is simultaneously generated by an ADC unit based on the first outputs, wherein the ADC unit generates the digital values of the continuous plurality of first outputs in the total i scans. In step 706B, a second input is provided by operatively coupling at least one second selecting unit to one of the first outputs in each scan. In step 708B, a digital value is generated by at least one ADC unit based on the second input, wherein the at least one ADC unit generates the digital values of the continuous plurality of first outputs in the total i scans. In this embodiment, the differential unit includes a plurality of subtractors, and the first inputs include plurality pairs of inputs, each of the subtractors generates one of the first outputs based on one of the plurality pairs of inputs. In another embodiment, the differential unit includes a plurality of dual-differential subtractors, and the first inputs include plurality sets of three inputs, each of dual-differential subtractors generates one of the first outputs based on one of the plurality sets of three inputs (the tree input could be adjacent or not adjacent), wherein each dual-differential subtractor includes the structure of dual-differential subtractor 234 shown in FIG. 3C, which will not be repeated again. Furthermore, in this embodiment, an amplifying unit is further included, which includes a plurality of amplifiers for respectively amplifying the first inputs before coupling them to the differential unit.

Figure 7B:
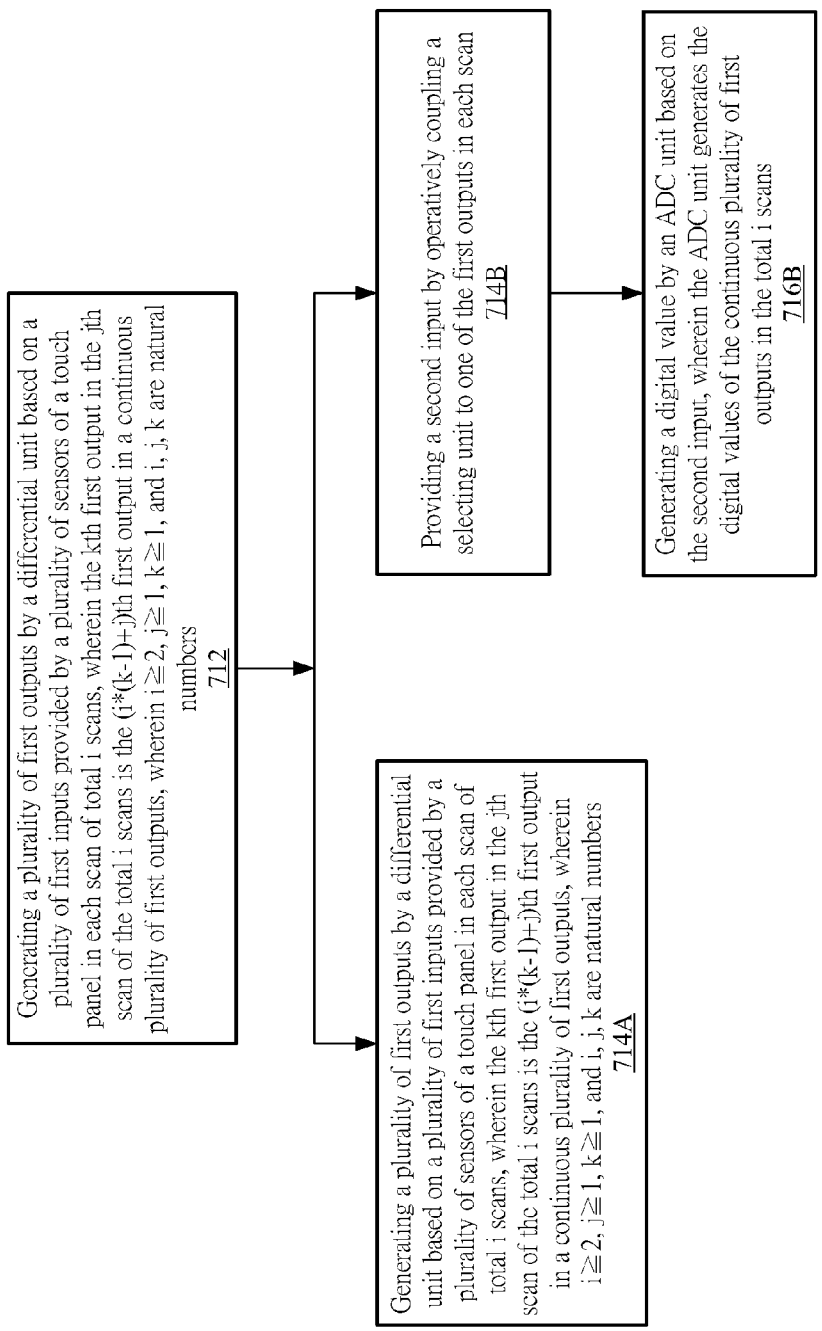

Referring to FIG. 7B, a flowchart illustrating another preferred method of the present invention is shown. In step 712, a plurality of first inputs is generated by a differential unit based on a plurality of first inputs provided by a plurality of sensors of a touch panel in each scan of total i scans, wherein the kth first output in the jth scan of the total i scans is the (i*(k−1)+j)th first output in a continuous plurality of first outputs, wherein $i \geq 2$, $j \geq 1$, $k \geq 1$, and i, j, k are natural numbers. In step 714A, a plurality of digital values is simultaneously generated by an ADC unit based on the first outputs, wherein the ADC unit generates the digital values of the continuous plurality of first outputs in the total i scans. In step 714B, a second input is provided by operatively coupling a selecting unit to one of the first outputs in each scan. In step 716B, a digital value is generated by an ADC unit based on the second input, wherein the ADC unit generates the digital values of the continuous plurality of first outputs in the total i scans. In this embodiment, the differential unit includes a plurality of subtractors, and the first inputs include plurality pairs of inputs, each of the subtractors generates one of the first outputs based on one of the plurality pairs of inputs, wherein the inputs of these subtractors are connected in series. In another embodiment, the differential unit includes a plurality of dual-differential subtractors, and the first inputs include plurality sets of three inputs, each of dual-differential subtractors generates one of the first outputs based on one of the plurality sets of three inputs (the tree input could be adjacent or not adjacent), wherein each dual-differential subtractor includes the structure of the dual-differential subtractor shown in FIG. 3D, which will not be repeated again. Furthermore, in this embodiment, an amplifying unit is further included, which includes a plurality of amplifiers for respectively amplifying the first inputs before coupling them to the differential unit.

Figure 7C:
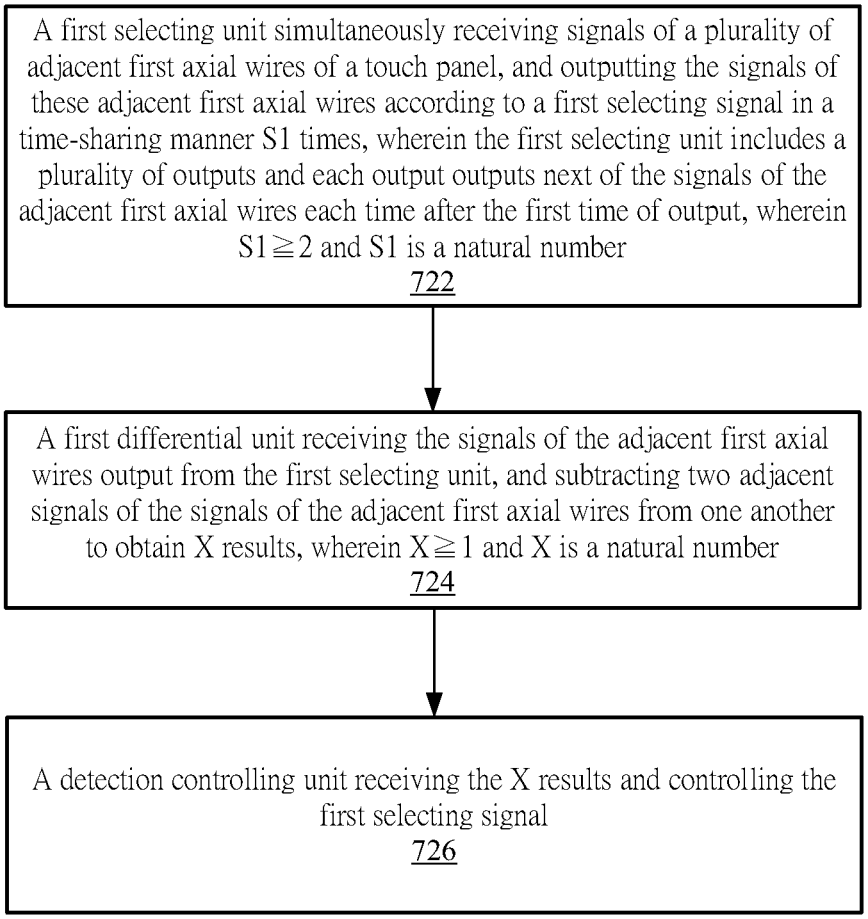

Referring FIG. 7C, a flowchart illustrating yet another preferred method of the present invention is shown. In step 722, signals of a plurality of adjacent first axial wires of a touch panel are simultaneously received by a first selecting unit, and the signals of these adjacent first axial wires are output according to a first selecting signal in a time-sharing manner $S_1$ times, wherein the first selecting unit has a plurality of outputs and each output outputs next of the signals of the adjacent first axial wires each time after the first time of output, wherein $S_1 \geq 2$ and $S_1$ is a natural number. In step 724, the signals of the adjacent first axial wires output from the first selecting unit are received by a first differential unit, and two adjacent signals of the signals of the adjacent first axial wires are subtracted from one another to obtain X results, wherein $X \geq 1$ and X is a natural number. In step 726, the X results are received and the first selecting signal is controlled by a detection controlling unit. In this embodiment, the first selecting unit may include one of the followings: a plurality of electronically actuated switches with $n_1$-bit outputs in $m_1$ segments, a plurality of data shifters with $m_2$ inputs and $n_2$ outputs, and a plurality of $m_3$-to-1 multiplexers, wherein $m_1 \geq 2$, $n_1 \geq 1$, $m_2 \geq 2$, $n_2 \geq 1$, $m_2 \geq n_2$, $m_3 \geq 2$ and $m_1$, $n_1$, $m_2$, $n_2$, $m_3$ are natural numbers. In addition, the first differential unit may include a plurality of first subtractors. In another embodiment, the first differential unit may include a plurality of first dual-differential subtractors, such as the structure of dual-differential subtractor 234 shown in FIG. 3C (explanation of which will not be repeated again).

In addition, the preferred method shown in FIG. 7C may further include simultaneously receiving signals of a plurality of adjacent second axial wires of the touch panel by a second selecting unit, and outputting the signals of these adjacent second axial wires according to a second selecting signal in a time-sharing manner $S_2$ times, wherein the second selecting unit has a plurality of outputs and each output outputs next of the signals of the adjacent second axial wires each time after the first time of output, wherein $S_2 \geq 2$ and $S_2$ is a natural number; receiving the signals of the adjacent second axial wires output from the second selecting unit by a second differential unit, and subtracting two adjacent signals of the signals of the adjacent second axial wires from one another to obtain Y results, wherein $Y \geq 1$ and Y is a natural number; receiving the Y results and controlling the second selecting signal by the detection controlling unit. In this embodiment, the second selecting unit may include one of the followings: a plurality of electronically actuated switches with $n_4$-bit outputs in $m_4$ segments, a plurality of data shifters with $m_5$ inputs and $n_5$ outputs, and a plurality of $m_6$-to-1 multiplexers, wherein $m_4 \geq 2$, $n_4 \geq 1$, $m_5 \geq 2$, $n_5 \geq 1$, $m_5 \geq n_5$, $m_6 \geq 2$ and $m_4$, $n_4$, $m_5$, $n_5$, $m_6$ are natural numbers. In addition, the second differential unit may include a plurality of third subtractors. In another embodiment, the second differential unit may include a plurality of second dual-differential subtractors, such as the structure of dual-differential subtractor 234 shown in FIG. 3C (explanation of which will not be repeated again).

The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. A device for parallel-scanning differential touch detection, comprising:
   a differential unit for generating a plurality of first outputs based on a plurality of first inputs in each scan of total i scans, wherein the kth first output in the jth scan of the total i scans is the $(i*(k-1)+j)$th first output in a continuous plurality of first outputs, wherein $i \geq 2$, $j \geq 1$, $k \geq 1$, and i, j, k are natural numbers; and
   a first selecting unit operatively coupled to a plurality of sensors of a touch panel for providing the first inputs, wherein each of the first inputs is operatively coupled to one of i continuous of the plurality of sensors in the total i scans.

2. The device of claim 1, further comprising:
   an analog-to-digital converting (ADC) unit for simultaneously generating a plurality of digital values based on the first outputs, wherein the ADC unit generates the digital values of the continuous plurality of first outputs in the total i scans.

3. The device of claim 1, further comprising:
   at least one second selecting unit for providing a second input by operatively coupling to one of the first outputs in each scan; and
   at least one ADC unit for generating a digital value of the second input, wherein the at least one ADC unit generates the digital values of the continuous plurality of first outputs in the total i scans.

4. The device of claim 1, wherein the differential unit includes a plurality of subtractors, and the first inputs include plurality pairs of inputs, each of the subtractors generating one of the first outputs based on one of the plurality pairs of inputs.

5. The device of claim 1, further comprising an amplifying unit including a plurality of amplifiers, each of the first inputs being coupled to the differential unit via one of the amplifiers.

6. A device for parallel-scanning differential touch detection, comprising:
   a differential unit for generating a plurality of first outputs based on a plurality of first inputs provided by a plurality of sensors of a touch panel in each scan of total i scans, wherein the kth first output in the jth scan of the total i scans is the $(i*(k-1)+j)$th first output in a continuous plurality of first outputs, wherein $i \geq 2$, $j \geq 1$, $k \geq 1$, and i, j, k are natural numbers.

7. The device of claim 6, further comprising:
   an analog-to-digital converting (ADC) unit for simultaneously generating a plurality of digital values based on the first outputs, wherein the ADC unit generates the digital values of the continuous plurality of first outputs in the total i scans.

8. The device of claim 6, further comprising:
   a selecting unit for providing a second input by operatively coupling to one of the first outputs in each scan; and
   an ADC unit for generating a digital value of the second input,
   wherein the ADC unit generates the digital values of the continuous plurality of first outputs in the total i scans.

9. The device of claim 6, wherein the differential unit includes a plurality of subtractors, and the first inputs include plurality pairs of inputs, each of the subtractors generating one of the first outputs based on one of the plurality pairs of inputs, wherein inputs of the subtractors are connected in series.

10. The device of claim 6, further comprising an amplifying unit including a plurality of amplifiers, each of the first inputs being coupled to the differential unit via one of the amplifiers.

11. A device for differential touch detection, comprising:
    a first selecting unit for simultaneously receiving signals of a plurality of adjacent first axial wires of a touch panel, and outputting the signals of these adjacent first axial wires according to a first selecting signal in a time-sharing manner $S_1$ times, wherein the first selecting unit includes a plurality of outputs and each output outputs next of the signals of the adjacent first axial wires each time after the first time of output, wherein $S_1 \geq 2$ and $S_1$ is a natural number, wherein at least two of the outputs are selected from two of the first axial wires which are non-neighboring;
    a first differential unit for receiving the signals of the adjacent first axial wires output from the first selecting unit, and subtracting two adjacent signals of the signals of the adjacent first axial wires from one another to obtain X results, wherein X 1 and X is a natural number; and
    a detection controlling unit for receiving the X results and controlling the first selecting signal.

12. The device of claim 11, wherein the first selecting unit includes a plurality of electronically actuated switches with $n_1$-bit outputs in $m_1$ segments, wherein $m_1 \geq 2$, $n_1 \geq 1$, and $m_1$ and $n_1$ are natural numbers.

13. The device of claim 11, wherein the first selecting unit includes a plurality of data shifters with $m_2$ inputs and $n_2$ outputs, wherein $m_2 \geq 2$, $n_2 \geq 1$, and $m_2$ and $n_2$ are natural numbers.

14. The device of claim 11, wherein the first selecting unit includes a plurality of $m_3$-to-1 multiplexers, wherein $m_3 \geq 2$ and $m_3$ is a natural number.

15. The device of claim 11, wherein the first differential unit includes a plurality of first subtractors.

16. The device of claim 11, further comprising:
    a second selecting unit for simultaneously receiving signals of a plurality of adjacent second axial wires of the touch panel, and outputting the signals of these adjacent second axial wires according to a second selecting signal in a time-sharing manner $S_2$ times, wherein the second selecting unit includes a plurality of outputs and each output outputs next of the signals of the adjacent second axial wires each time after the first time of output, wherein $S_2 \geq 2$ and $S_2$ is a natural number;

a second differential unit for receiving the signals of the adjacent second axial wires output from the second selecting unit, and subtracting two adjacent signals of the signals of the adjacent second axial wires from one another to obtain Y results, wherein $Y \geq 1$ and Y is a natural number; and the detection controlling unit for receiving the Y results and controlling the second selecting signal.

17. The device of claim 11, wherein the first selecting unit includes a plurality of electronically actuated switches with $n_4$-bit outputs in $m_4$ segments, wherein $m_4 \geq 2$, $n_4 \geq 1$, and $m_4$ and $n_4$ are natural numbers.

18. The device of claim 11, wherein the second selecting unit includes a plurality of data shifters with $m_5$ inputs and $n_5$ outputs, wherein $m_5 \geq 2$, $n_5 \geq 1$, and $m_5$ and $n_5$ are natural numbers.

19. The device of claim 11, wherein the second selecting unit includes a plurality of $m_6$-to-1 multiplexers, wherein $m_6 \geq 2$ and $m_6$ is a natural number.

20. The device of claim 11, wherein the second differential unit includes a plurality of third subtractors.

21. The device of claim 11, wherein the second differential unit includes a plurality of second dual-differential subtractors, wherein each of the second dual-differential subtractors includes:
two third subtractors, inputs of which being connected in series; and
one fourth subtractor for receiving outputs of the two third subtractors and generating one of the Y results.

22. A method for parallel-scanning differential touch detection, comprising:
providing a plurality of first inputs by operatively coupling a first selecting unit to a plurality of sensors of a touch panel, wherein each of the first inputs operatively coupling to i continuous of the plurality of sensors in total i scans; and
generating a plurality of first outputs based on the first inputs by a differential unit in each scan of the total i scans, wherein the kth first output in the jth scan of the total i scans is the $(i*(k-1)+j)$th first output in a continuous plurality of first outputs, wherein $i \geq 2$, $j \geq 1$, $k \geq 1$, and i, j, k are natural numbers.

23. The method of claim 22, further comprising:
simultaneously generating a plurality of digital values by an analog-to-digital converting (ADC) unit based on the first outputs, wherein the ADC unit generates the digital values of the continuous plurality of first outputs in the total i scans.

24. The method of claim 22, further comprising:
providing a second input by at least one second selecting unit operatively coupling to one of the first outputs in each scan; and
generating a digital value of the second input by at least one ADC unit,
wherein the at least one ADC unit generates the digital values of the continuous plurality of first outputs in the total i scans.

25. The method of claim 22, wherein the differential unit includes a plurality of subtractors, and the first inputs include plurality pairs of inputs, each of the subtractors generating one of the first outputs based on one of the plurality pairs of inputs.

26. The method of claim 22, further comprising amplifying each of the first inputs before coupling it to the differential unit by an amplifying unit including a plurality of amplifiers.

27. A method for parallel-scanning differential touch detection, comprising:
generating a plurality of first outputs by a differential unit based on a plurality of first inputs provided by a plurality of sensors of a touch panel in each scan of total i scans, wherein the kth first output in the jth scan of the total i scans is the $(i*(k-1)+j)$th first output in a continuous plurality of first outputs, wherein $i \geq 2$, $j \geq 1$, $k \geq 1$, and i, j, k are natural numbers.

28. The method of claim 27, further comprising:
simultaneously generating a plurality of digital values by an analog-to-digital converting (ADC) unit based on the first outputs, wherein the ADC unit generates the digital values of the continuous plurality of first outputs in the total i scans.

29. The method of claim 27, further comprising:
providing a second input by a selecting unit operatively coupling to one of the first outputs in each scan; and
generating a digital value of the second input by an ADC unit,
wherein the ADC unit generates the digital values of the continuous plurality of first outputs in the total i scans.

30. The method of claim 27, wherein the differential unit includes a plurality of subtractors, and the first inputs include plurality pairs of inputs, each of the subtractors generating one of the first outputs based on one of the plurality pairs of inputs, wherein inputs of the subtractors are connected in series.

31. The method of claim 27, further comprising amplifying each of the first inputs before coupling it to the differential unit by an amplifying unit including a plurality of amplifiers.

32. A method for differential touch detection, comprising:
a first selecting unit simultaneously receiving signals of a plurality of adjacent first axial wires of a touch panel, and outputting the signals of these adjacent first axial wires according to a first selecting signal in a time-sharing manner $S_1$ times, wherein the first selecting unit includes a plurality of outputs and each output outputs next of the signals of the adjacent first axial wires each time after the first time of output, wherein $S_1 \geq 2$ and $S_1$ is a natural number, wherein at least two of the outputs are selected from two of the first axial wires which are non-neighboring;
a first differential unit receiving the signals of the adjacent first axial wires output from the first selecting unit, and subtracting two adjacent signals of the signals of the adjacent first axial wires from one another to obtain X results, wherein $X \geq 1$ and X is a natural number; and
a detection controlling unit receiving the X results and controlling the first selecting signal.

33. The method of claim 32, wherein the first selecting unit includes one of followings: a plurality of electronically actuated switches with $n_1$-bit outputs in $m_1$ segments, a plurality of data shifters with $m_2$ inputs and $n_2$ outputs and a plurality of $m_3$-to-1 multiplexer, wherein $m_1 \geq 2$, $n_1 \geq 1$, $m_2 \geq 2$, $n_2 \geq 1$ and $m_3 \geq 2$, and $m_1$, $n_1$, $m_2$, $n_2$ and $m_3$ are natural numbers.

34. The method of claim 32, wherein the first differential unit includes a plurality of first subtractors.

35. The method of claim 32, further comprising:
a second selecting unit simultaneously receiving signals of a plurality of adjacent second axial wires of the touch panel, and outputting the signals of these adjacent second axial wires according to a second selecting signal in a time-sharing manner $S_2$ times, wherein the second selecting unit includes a plurality of outputs and each output outputs next of the signals of the adjacent second axial wires each time after the first time of output, wherein $S_2 \geq 2$ and $S_2$ is a natural number;

a second differential unit receiving the signals of the adjacent second axial wires output from the second selecting unit, and subtracting two adjacent signals of the signals of the adjacent second axial wires from one another to obtain Y results, wherein $Y \geq 1$ and Y is a natural number; and the detection controlling unit receiving the Y results and controlling the second selecting signal.

36. The method of claim 32, wherein the first selecting unit includes one of followings: a plurality of electronically actuated switches with $n_4$-bit outputs in $m_4$ segments, a plurality of data shifters with $m_5$ inputs and $n_5$ outputs and a plurality of $m_6$-to-1 multiplexer, wherein $m_4 \geq 2$, $n_4 \geq 1$, $m_5 \geq 2$, $n_5 \geq 1$ and $m_6 \geq 2$, and $m_4$, $n_4$, $m_5$, $n_5$ and $m_6$ are natural numbers.

37. The method of claim 32, wherein the second differential unit includes a plurality of third subtractors.

38. The method of claim 32, wherein the second differential unit includes a plurality of second dual-differential subtractors, wherein each of the second dual-differential subtractors includes:

two third subtractors, inputs of which being connected in series; and one fourth subtractor for receiving outputs of the two third subtractors and generating one of the Y results.

* * * * *